United States Patent [19]

Regione

[11] Patent Number: 4,926,240

[45] Date of Patent: May 15, 1990

[54] SEMICONDUCTOR PACKAGE HAVING RECESSED DIE CAVITY WALLS

[75] Inventor: Brian A. Regione, Mes, Ariz.

[73] Assignee: Motorola, Inc., Schaumburg, Ill.

[21] Appl. No.: 329,741

[22] Filed: Mar. 28, 1989

[51] Int. Cl.$^5$ ...................... H01L 23/12; H01L 23/04
[52] U.S. Cl. .......................................... 357/74; 357/68
[58] Field of Search .................... 357/74, 68; 174/52.4

[56] References Cited

FOREIGN PATENT DOCUMENTS 0207643 11/1984 Japan ..................................... 357/74
0150352 7/1986 Japan ..................................... 357/74

*Primary Examiner*—Rolf Hille
*Assistant Examiner*—S. V. Clark
*Attorney, Agent, or Firm*—Harry A. Wolin

[57] ABSTRACT

A semiconductor package having recessed die cavity walls to prevent rejectable packages due to excess die attach material overflow. A recessed area is disposed beneath a wire bond shelf and serves as an area into which excess die attach material may flow so that it does not impede wire bonding by flowing onto the bond posts disposed on the wire bond shelf or the bond pads disposed on the top of a semiconductor die.

17 Claims, 1 Drawing Sheet

4,926,240

SEMICONDUCTOR PACKAGE HAVING RECESSED DIE CAVITY WALLS

BACKGROUND OF THE INVENTION

This invention relates, in general, to semiconductor packages, and more particularly to a semiconductor package having recessed die cavity walls.

An often encountered problem in the assembly of semiconductor packages occurs when die attach material flows out of the die cavity and onto bond pads and bond posts. This problem greatly affects the wire bonding ability and reduces the attainable yield. Prior attempts to remedy this problem have been somewhat successful although they have not completely eliminated the problem and are often difficult to implement.

Prior art solutions include the formation of a moat within the die cavity. Excess die attach material flows into the moat before it flows up the cavity wall or the side of the semiconductor die. The use of this type mode has been successful in pressed ceramic packages as well as other one piece packages wherein the moat may be formed without significant variance in the fabrication process. However, moats are more difficult to form in laminated multilayer ceramic packages. The formation of a moat in this type package would most likely require use of an additional ceramic layer disposed so that desired package tolerances might be maintained. This would cause a significant increase in the difficulty and cost of manufacturing laminated multilayer ceramic packages.

Another prior art method of solving the die attach material overflow problem has been to enlarge the size of the die cavity. Although this helps with the die attach material overflow problem, there are many logistical problems that are incurred by enlarging the die cavity size. First, the enlarged die cavity requires additional space and therefore, a larger semiconductor package is needed to maintain the required internal dimensions of the package. Second, there will be a larger space between the semiconductor die and the bond posts which are disposed about the cavity thereby increasing the length of the bonding wires and jeopardizing reliability.

A further method of solving the die attach overflow problem is disclosed in copending application Ser. No. 07/286,676 entitled "Semiconductor Package Having an Outwardly Arced Die Cavity" filed on Dec. 19, 1988. This application discloses a semiconductor package wherein the die cavity includes a plurality of sides that are outwardly arced from the center of the die cavity. This configuration allows for reduced number of rejects due to die attach material overflow while reducing the minimum necessary die cavity size. Although this method has met a good deal of success, it is advantageous to have other methods of reducing die attachment material overflow problems. In view of the above, a die cavity that would reduce the die attachment material overflow problem while maintaining or reducing the minimum necessary cavity size would be highly desirable.

SUMMARY OF THE INVENTION

Accordingly, it is an object of the present invention to provide a semiconductor package having recessed die cavity walls that reduces die attach material overflow problems.

Another object of this invention is to provide a semiconductor package having recessed die cavity walls that may be easily employed in laminated multilayer ceramic packages.

It is an additional object of the present invention to provide a semiconductor package having recessed die cavity walls that requires a minimal amount of area.

A further object of the present invention is to provide a semiconductor package having recessed die cavity walls that do not affect the structural limitations required in a semiconductor package.

The foregoing and other objects and advantages are achieved in the present invention by one embodiment in which, as a part thereof, makes use of a die cavity having a plurality of walls that are partially recessed. The recessed areas of the walls are beneath the wire bond shelves. This configuration allows for a reduced number of rejects due to die attach material overflow onto the top of the die as well as the bond posts while reducing the minimum necessary die cavity size.

A more complete understanding of the present invention can be attained by considering the following detailed description in conjunction with the accompanying drawings.

DETAILED DESCRIPTION OF THE INVENTION

Figure 1:
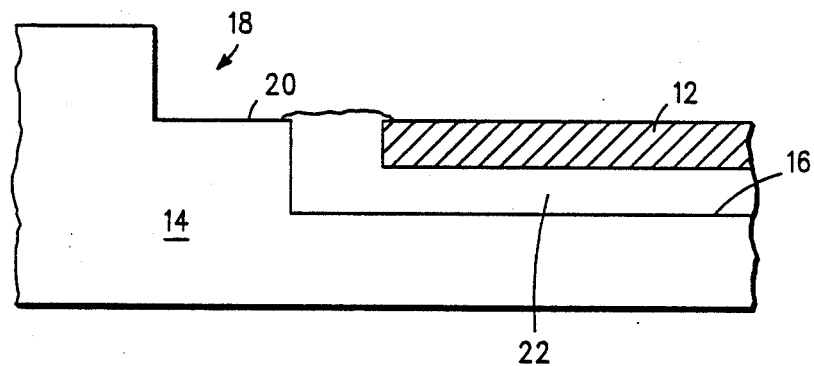
FIG. 1 is a highly enlarged cross-sectional view a portion of a prior art semiconductor package having a die disposed therein.

FIG. 1 is a highly enlarged cross-sectional view of a portion of a prior art semiconductor package 10 having a die 12 disposed therein. Semiconductor package 10 is comprised of a ceramic material and is generally formed by laminating a plurality of layers. However, it should be understood that semiconductor package 12 may be comprised of a one-piece pressed ceramic. Semiconductor package 10 includes a base portion 14 having a die attach area 16. Walls 18 extend from base portion 14 and surround die attach area 16 thereby forming a die cavity. One or more walls 18 include a wire bond shelf 20 that includes a plurality of bond posts to which die 12 is wire bonded. One skilled in the art will understand that the bond posts disposed on wire bond shelf 20 are electrically connected to the external leads (not shown) of semiconductor package 10.

The configuration of semiconductor package 10 makes the package as a whole susceptible to a major problem. When die 12 is bonded to die attach area 16 of base portion 14 using one of many well known die attach materials 22, excess die attach material 22 is likely to flow onto wire bond shelf 20 and cover bond posts. Additionally, excess die attach material 22 is also likely to flow onto the bond pads of die 12. Obviously, the flow of excess die attach material 22 will prohibit effective wire bonding and cause the semiconductor package to be rejected.

Figure 2:
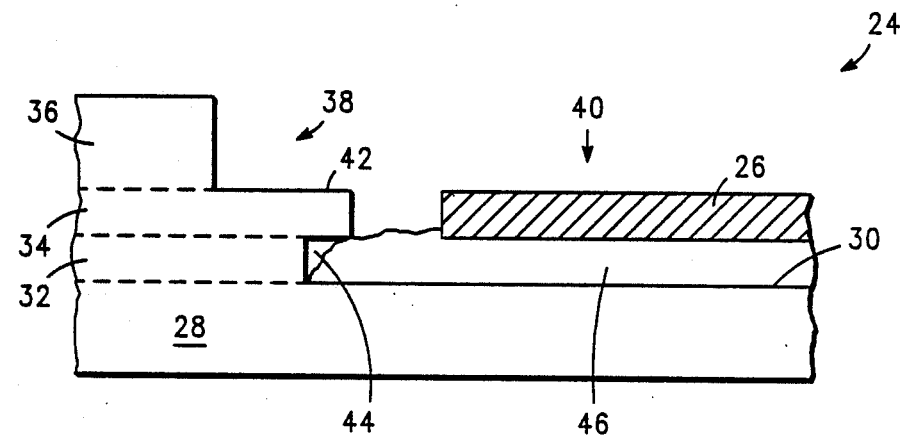
FIG. 2 is a highly enlarged cross-sectional view of a portion of a semiconductor package having a die disposed therein.

FIG. 2 is a highly enlarged cross-sectional view of a portion of a semiconductor package 24 having a die 26 disposed therein. The body of semiconductor package 24 is comprised of a series of laminated ceramic layers although it could be comprised of a one-piece pressed ceramic. Additionally, the body of semiconductor package 24 could be made of materials other than ceramic such as aluminum nitride.

As mentioned above, the body of semiconductor package 24 is comprised of a plurality of laminated ceramic layers. These layers include a base layer 28 which includes a die attach area 30. A recessed layer 32 is disposed on base layer 28 and a wire bond shelf layer 34 is disposed on recessed layer 32. Wire bond shelf layer 34 includes a plurality of bond posts and interconnect metallization electrically connected to the bond posts. A top layer 36 is disposed on wire bond shelf layer 34. Once the entire semiconductor package 24 has been assembled including die 26 being electrically connected, a ceramic cap (not shown) is laminated to top layer 36 to seal semiconductor package 24.

The various layers disposed on base layer 28 form a plurality of walls 38 that surround die attach area 30 thereby forming a die cavity 40 in which die 26 is disposed. Walls 38 include a wire bond shelf 42 upon which a plurality of bond posts (not shown) are disposed. One skilled in the art will understand that the bond posts are electrically connected to interconnect lines which in turn are electrically connected to the outer leads (not shown) of package 24. Disposed beneath wire bond shelf 42 is a recessed area 44. Recessed area 44 serves as an area into which excess die bond material 46 may flow so that it does not flow onto the top of die 26 or onto wire bond shelf 42 thereby impeding wire bonding. Common configurations include recessed areas 44 disposed beneath wire bond shelf 42 on two oppositely facing walls so that excess die bond material 46 may flow therein at at least two different places. Another preferred configuration includes a recessed area 44 beneath each wire bond shelf 42 disposed in die cavity 40. It should be understood that the idea of recessed area 44 may be employed in conjunction with the prior art die cavity moat or the radial die cavity disclosed in the background of the invention.

Thus it is apparent that there has been provided, in accordance with the invention, an improved semiconductor package having recessed die cavity walls which meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A semiconductor package comprising:
   a base portion including a die attach area; and
   a plurality of walls surrounding said die attach area to form a die cavity, at least one of said walls having a recessed areas to receive excess die attach material.

2. The semiconductor package of claim 1 wherein two oppositely facing walls of the die cavity include a recessed area.

3. The semiconductor package of claim 1 wherein all the walls of the die cavity include a recessed area.

4. The semiconductor package of claim 1 wherein said semiconductor package is comprised of a ceramic material.

5. The semiconductor package of claim 4 wherein said semiconductor package is comprised of a plurality of ceramic layers that are laminated together.

6. The semiconductor package of claim 5 comprising the following ceramic layers being laminated together:
   a base layer having a die attach area thereon;
   a recessed layer disposed on said base layer;
   a wire bond shelf layer disposed on said recessed layer, said wire bond shelf layer having a wire bond shelf including bond posts disposed thereon and interconnect lines electrically connected to said bond posts; and
   a top layer disposed on said wire bond shelf layer, said top layer to have a cap disposed thereon.

7. A semiconductor package comprised of a plurality of laminated ceramic layers, said semiconductor package comprising:
   a base portion having a die attach area; and
   a plurality of walls surrounding said die attach area to form a die cavity, at least one of said walls having a wire bond shelf and a recessed area beneath said wire bond shelf to receive excess die attach material.

8. The semiconductor package of claim 7 wherein two oppositely facing walls of the die cavity include a recessed area beneath a wire bond shelf.

9. The semiconductor package claim 7 wherein all the walls of the die cavity include a recessed area beneath a wire bond shelf.

10. The semiconductor package of claim 7 wherein all the walls of the die cavity that include a wire bond shelf include a recessed area beneath said wire bond shelf.

11. A semiconductor package comprising:
    a body, said body comprising a base portion having a die attach area and a plurality of walls surrounding said die attach area to form a die cavity, at least one of said walls having a wire bond shelf having bond posts disposed thereon, said bond posts being electrically connected to interconnect lines, said wire bond shelf further having a recessed area to receive excess die attach material disposed beneath it on said at least one wall;
    a semiconductor die disposed on said die attach area of said base portion, said semiconductor die further being wire bonded to said bond posts; and
    a cap disposed on said body covering said die cavity including said semiconductor die disposed therein.

12. The semiconductor package of claim 11 wherein the body and the cap of said semiconductor package are comprised of a ceramic material.

13. The semiconductor package of claim 12 wherein the body of said semiconductor package is comprised of a plurality of ceramic layers that are laminated together.

14. The semiconductor package of claim 13 wherein the body comprises the following ceramic layers being laminated together:
    a base layer having a die attach area thereon;
    a recessed layer disposed on said base layer;
    a wire bond shelf layer disposed on said recessed layer, said wire bond shelf layer having a wire bond shelf including bond posts disposed thereon and interconnect lines electrically connected to said bond posts; and
    a top layer disposed on said wire bond shelf layer, said top layer to have a cap disposed thereon.

15. The semiconductor package of claim 14 wherein the body comprises two oppositely facing walls of the die cavity having a recessed area beneath a wire bond shelf.

16. The semiconductor package of claim 14 wherein the body comprises all the walls of the die cavity having a recessed area beneath a wire bond shelf.

17. The semiconductor package of claim 14 wherein all the walls of the die cavity having a wire bond shelf also include a recessed area beneath said wire bond shelf.

* * * * *